(12) United States Patent
Nagarajan

(10) Patent No.: US 7,187,077 B1
(45) Date of Patent: Mar. 6, 2007

(54) INTEGRATED CIRCUIT HAVING A LID AND METHOD OF EMPLOYING A LID ON AN INTEGRATED CIRCUIT

(75) Inventor: Kumar Nagarajan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 134 days.

(21) Appl. No.: 10/805,112

(22) Filed: Mar. 19, 2004

(51) Int. Cl.
*H01L 23/04* (2006.01)

(52) U.S. Cl. ............... 257/730; 257/678; 257/712; 257/731; 257/787

(58) Field of Classification Search ............ 257/678, 257/787, 712, 730, 731
See application file for complete search history.

(56) References Cited

U.S. PATENT DOCUMENTS 6,770,513 B1 * 8/2004 Vikram et al. ............ 438/122
7,012,326 B1 * 3/2006 Wu et al. ................... 257/678

OTHER PUBLICATIONS

U.S. Appl. No. 10/648,118, filed Aug. 25, 2003, Chee et al.
U.S. Appl. No. 10/782,184, filed Feb. 18, 2004, Wu et al.

* cited by examiner

*Primary Examiner*—Doug Menz
(74) *Attorney, Agent, or Firm*—John J. King

(57) ABSTRACT

The present invention relates to a lid for an integrated circuit. According to one embodiment, an integrated circuit having a lid comprises a substrate having a flat surface and extending a first length and a lid having a recess and a foot portion. The lid generally has a second length shorter than the first length, and is positioned on the flat surface of the substrate. Finally, a bonding agent is positioned on the flat surface adjacent the foot portion of the lid. According to an alternate embodiment, a second component is positioned on the substrate outside the foot portion, and an adhesive seal is positioned on the substrate adjacent the foot and covering the component. A method of securing a lid to an integrated circuit is also disclosed.

15 Claims, 4 Drawing Sheets

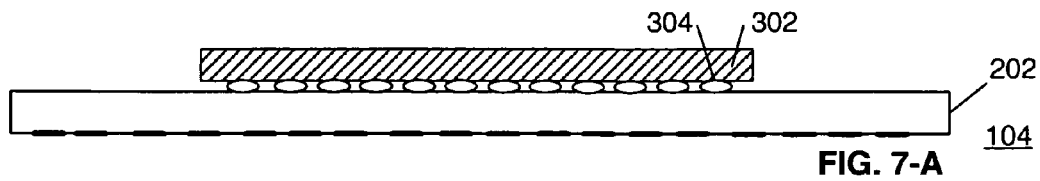
FIG. 7-A
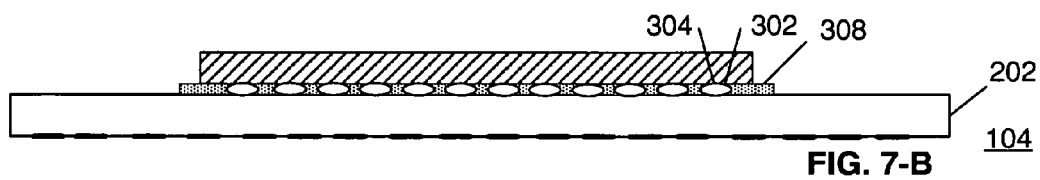
FIG. 7-B
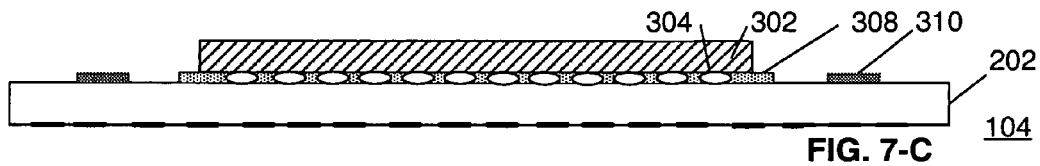
FIG. 7-C
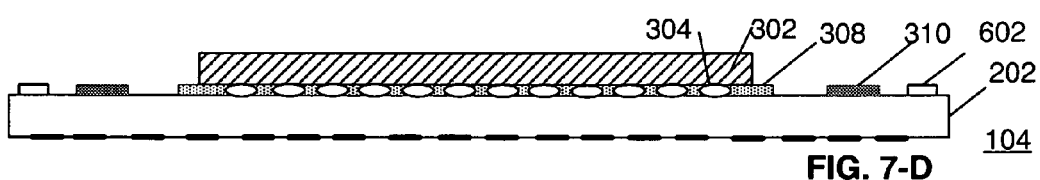
FIG. 7-D
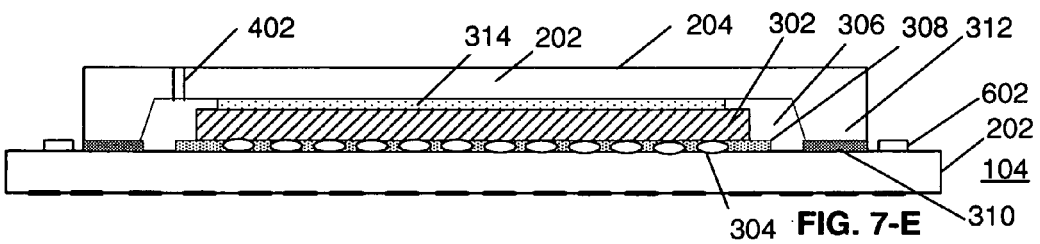
FIG. 7-E
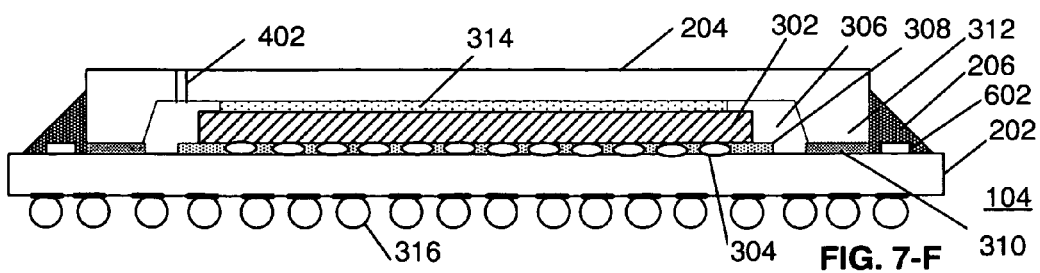
FIG. 7-F

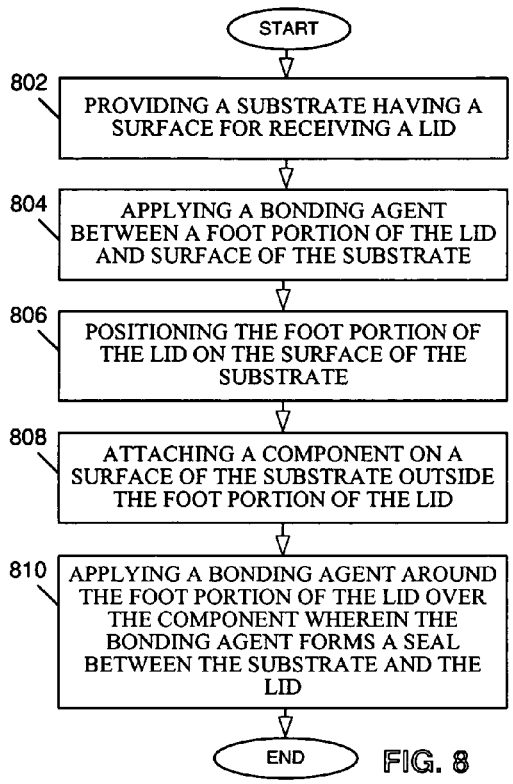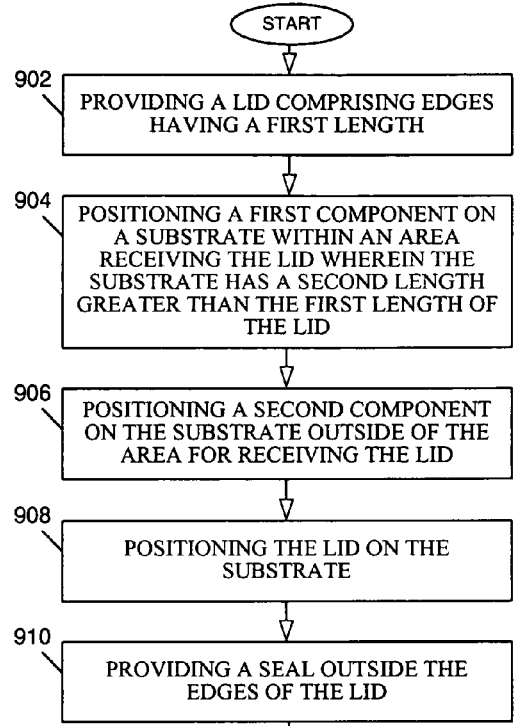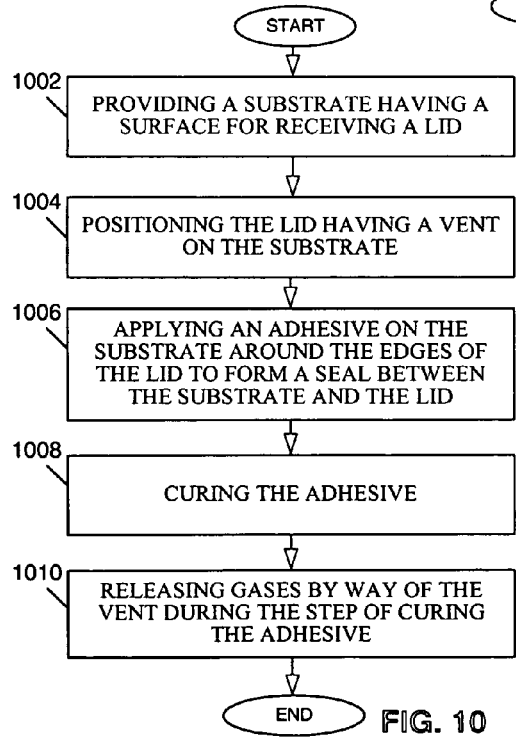

INTEGRATED CIRCUIT HAVING A LID AND METHOD OF EMPLOYING A LID ON AN INTEGRATED CIRCUIT

FIELD OF THE INVENTION

The present invention relates generally to an integrated circuit having a lid, and in particular, to a method of securing a lid to an integrated circuit.

BACKGROUND OF THE INVENTION

Heat sinks are used in a variety of electronic devices to dissipate heat from the device, preventing any failure of or damage to the device. Heat sinks are made of a variety of heat conducting materials and are formed in a variety of shapes to adequately conduct the heat from the device. More specifically, heat sinks, also commonly called lids, are used with integrated circuits to reduce the heat of the semiconductor die to enable the integrated circuit to function properly. The purpose of the lid is to keep a semiconductor junction, such as a junction of the transistor, below a maximum specified operating temperature. Another purpose of the lid may be to provide some physical protection for the components within the lid. A lid for an integrated circuit, commonly made of a metallic or ceramic material, is attached on top of a flip chip package to provide protection to the silicon die and other discrete surface mount components and to increase thermal conductivity of the package.

However, these types of lid heat sinks often exhibit the problem of separating from the top of an integrated circuit package. Because the adhesion strength of the adhesive used to attach the conductive lid is sometimes not strong enough to hold the conductive lid to the package, the conductive lid can come off of the package. Proper material construction and processing of the lid, the package, and the adhesive is required so that the lid will stay attached to the package during the assembly and long term field usage. Degradation of adhesion can be caused by many factors, including improper dispensing of adhesive that does not produce full adhesive surface as designed, shear stresses induced due to thermal expansion/shrinkage differences at the interfaces, push/pull stresses induced due to warping of the silicon, package, and/or board, adhesive degradation due to chemical attack, etc. Excessive component handling stresses, such as excessive torque or pressure during test, assembly, or rework, can also result in separation of the lid from the package.

Currently, a wide variety of components, such as FPGA, ASIC, graphics, microprocessors, etc., employ flipchip ball grid array (BGA) packages. As the requirements for large size silicon chips and/or passive devices used on packages increase, a smaller bond area is used to bond the lid to the substrate. However, the smaller bond area even further reduces adhesion of the lid to the substrate, often leading to lid delamination when subjected to post assembly thermal and mechanical stresses. Also, conventional designs having smaller bond areas can lead to the misalignment of the lid with respect to the substrate during lid assembly. Finally, conventional lid designs can have gaps in the epoxy bead, permitting moisture, solvents and cleaning solutions to enter the package. Such gaps can result in contamination of the thermal grease that conducts heat from the back of the die, possibly impacting the functionality of the device.

Accordingly, there is a need for an improved lid for an integrated circuit and method of securing a lid to an integrated circuit.

SUMMARY OF THE INVENTION

The present invention relates to a lid for an integrated circuit. According to one embodiment, an integrated circuit having a lid comprises a substrate having a flat surface and extending a first length and a lid having a recess and a foot portion. The lid generally has a second length shorter than the first length, and is positioned on the flat surface of the substrate. Finally, a bonding agent is positioned on the flat surface adjacent the foot portion of the lid. According to other aspects of the invention, a lip can be used on the foot portion to improve the bonding strength. Also, a vent can be employed to enable the release of gases during the curing of an adhesive used in the bonding agent adjacent the foot portion of the lid.

According to an alternate embodiment, an integrated circuit having a lid comprises a substrate and a first component positioned on the substrate. A lid having a recessed portion adapted to receive the first component and having a foot portion is positioned on the substrate. A second component is positioned on the substrate outside the foot portion. Finally, an adhesive seal is positioned on the substrate adjacent the foot and covering the component, the adhesive seal forming a bond between the lid and the substrate. The first component may be a flip chip while the second component may be a discrete component, for example.

A method of securing a lid to an integrated circuit is also disclosed. The method preferably comprises the steps of providing a substrate having a surface for receiving the lid; positioning a foot portion of the lid on the surface of the substrate; and applying a bonding agent around the foot portion of the lid, the bonding agent forming a seal between the substrate and the lid. Method of positioning a lid having a smaller length than a substrate is also described. Finally, a method for manufacturing an integrated circuit having a lid attached by curing an adhesive is also described.

BRIEF DESCRIPTION OF THE DRAWINGS

FIG. 7 is a series of figures showing the formation of an integrated circuit according to an alternate embodiment of the present invention;

FIG. 8 is a flow chart showing a method of forming an integrated circuit having a component outside a lid according to an embodiment of the present invention;

FIG. 9 is a flow chart showing a method of applying a lid having a first length to a substrate having a second length according to an embodiment of the present invention; and FIG. 10 is a flow chart showing a method of securing a lid to an integrated circuit using an adhesive according to an embodiment of the present invention.

DETAILED DESCRIPTION OF THE DRAWINGS

The various embodiments of the present invention address the need to provide a robust adhesive bond between the lid and the substrate, and to provide a lid construction that enhances adhesion of the lid to the substrate. The embodiments preferably use a commercial adhesive to improve the adhesion of the lid to the substrate by the formation of fillet on the side of the lid. According to an alternate embodiment, passive elements outside of the lid area and protected by the adhesive. The embodiments of the present invention can be extended to multi-chip modules where there is a space limitation for bonding the lid to the substrate due to the presence of multiple dies and passive components.

Figure 1:
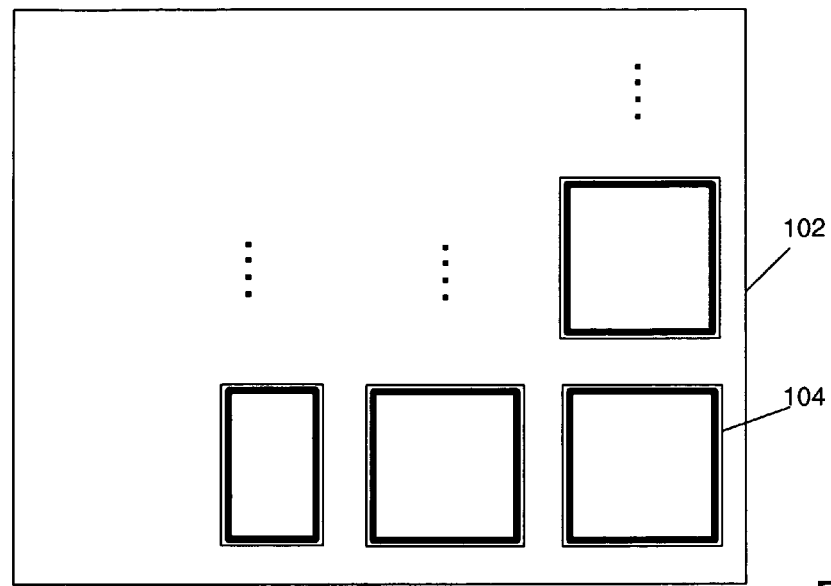
FIG. 1 is a top plan view of a printed circuit board having a plurality of components according to an embodiment of the present invention.
Figure 2:
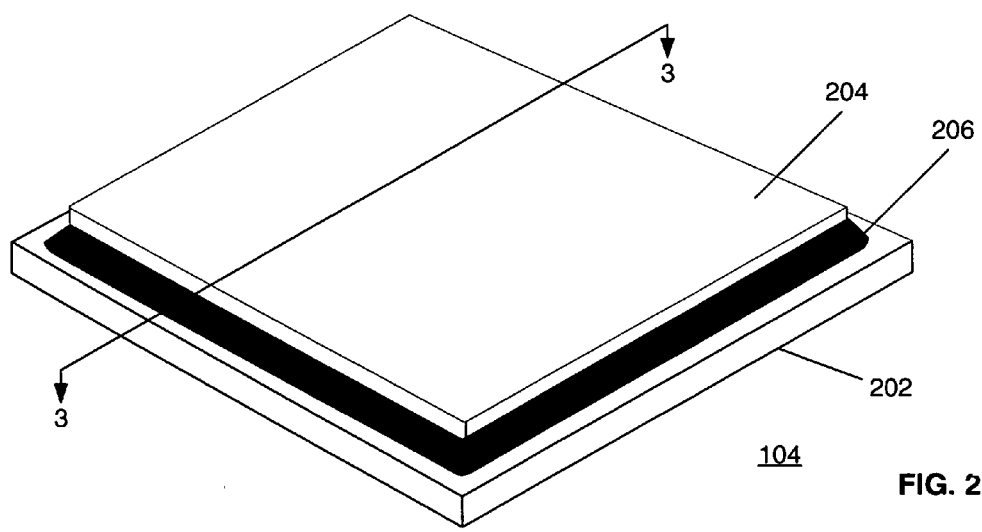
FIG. 2 is a perspective view of a component 104 according to an embodiment of the present invention.

Turning first to FIG. 1, a top plan view of a printed circuit board having a plurality of components according to an embodiment of the present invention is shown. In particular, a printed circuit board 102 comprises a plurality of components 104, such as a plurality of BGAs having a lid according to the present invention. The components 104 may be any shape, such as the square or rectangular shapes shown. A perspective view of a component 104 according to an embodiment of the present invention is shown in FIG. 2. Component 104 comprises a substrate 202 and a lid 204. Also shown in FIG. 2 is a seal 206 surrounding the lid 204. As can be seen, the four edges of the lid are positioned within the four edges of the substrate, providing room to position a component and create a seal on the top surface of the substrate adjacent the four edges of the lid. Although all four edges of the lid are preferably positioned within the four edges of the substrate, any number of edges could be positioned within the corresponding edges of the substrate. Additional details of the lid 204 and the seal 206 will be described in more detail in reference to the cross-sectional views of FIGS. 3–6 taken at lines 3—3.

Figure 3:
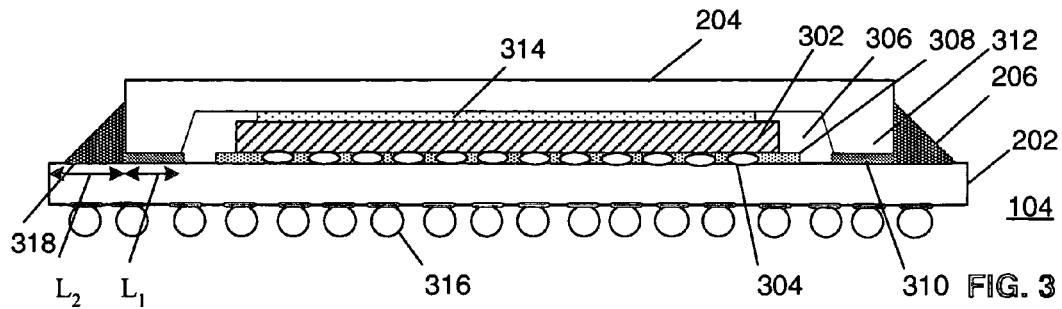
FIG. 3 is a cross-sectional view of the component 104 according to one embodiment of the present invention.

Turning now to FIG. 3, a cross-sectional view of the component 104 according to one embodiment of the present invention is shown. In particular, component 104 comprises a BGA having a flip chip 302 coupled to the substrate 202 by a plurality of solder bumps 304. The flip chip 302 and any other components are positioned within a recessed portion 306 of the lid 204. The lid may be a square comprising a conductive material, such as copper, nickel-plated copper or aluminum, and have an approximate thickness between 0.5 mm and 3 mm, although other shapes, materials and/or thicknesses may be used. Also shown in the cross sectional view is an underfill layer 308 between the flip chip 302 and the substrate 202. A bonding agent 310 enables a foot portion 312 of the lid to be secured to the substrate 202. A thermal gel 314 can also be used to secure the lid 204 to the flip chip 302. The thermal gel is generally thermally conductive and a soft adhesive and may be, for example, lid attach epoxy from AI Technology, Inc., Princeton Junction, N.J. Finally, solder balls 316 are attached to the bottom of the substrate 202 as shown.

The adhesive bond area $L_1$ of the foot portion 312 may be 1.5–2.5 mm wide, while the lid may have a length of approximately 0.5–2.5 mm shorter than the length of the substrate, leaving an exposed edge 318 having a length L2. The exposed edge 318 may be between approximately 0.25–1.25 mm. One advantage of a smaller lid being used is that there is less concern for misalignment of lid to substrate. The adhesive used to form the seal 206 may be, for example, lid attach epoxy from Ablestik Laboratories, Rancho Dominguez, Calif. The use of the seal 206 improves the adhesion of the lid to the substrate by the formation of fillet on the side of the lid. Also, the seal 206 prevents contaminants from entering the integrated circuit.

Figure 4:
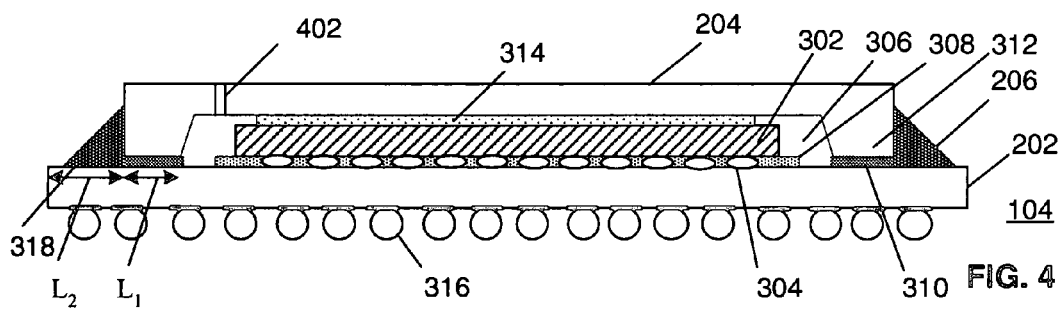
FIG. 4 is a cross-sectional view of the component 104 comprising a lid having a vent according to an alternate embodiment of the present invention.
Figure 5:
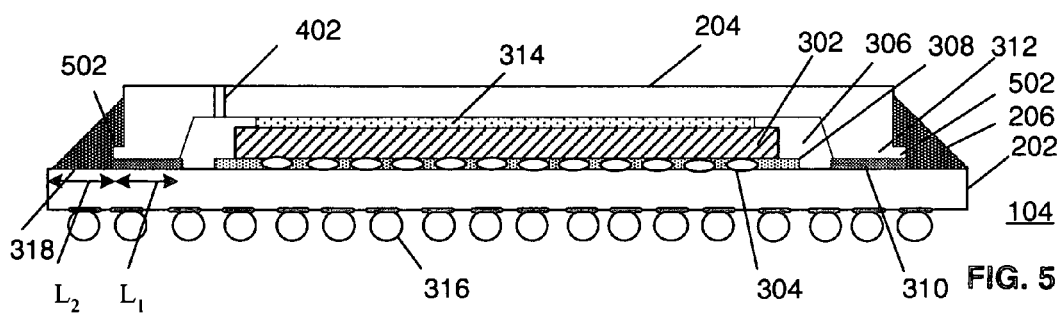
FIG. 5 is a cross-sectional view of the component 104 comprising a lid having a lip on a foot portion according to another alternate embodiment of the present invention.

Turning now to FIG. 4, a cross-sectional view of the component 104 comprising a lid having a vent according to an alternate embodiment of the present invention is shown. In particular, vent 402 enables the seal 206 to comprise an adhesive that must be cured to provide the seal 206. That is, any gases or pressure created by the curing process can be released by the vent. Such gases or pressure would prevent any contaminants from entering the recess 306. The vent 402 may have a diameter of 0.5–1.0 mm to provide for the release of gases during the adhesive curing process. The vent may be optionally sealed after the curing process. As shown in the alternate embodiment of FIG. 5, the component 104 comprises a lid having a lip portion 502. The lip portion 502 generally enables an improved seal and helps prevent the lid for separating from the substrate.

Figure 6:
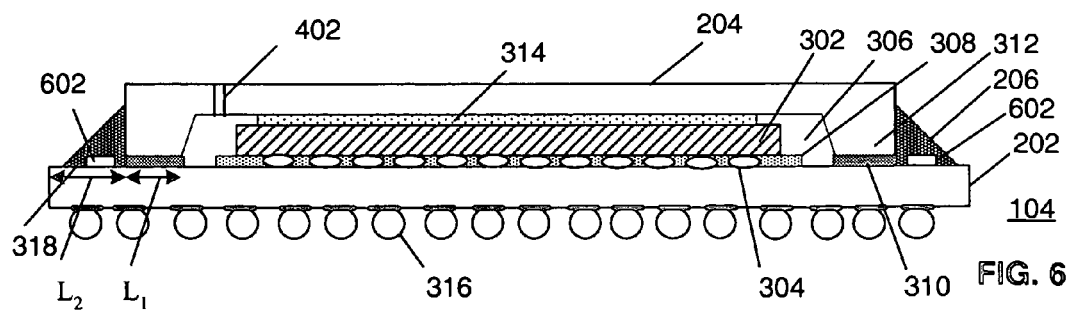
FIG. 6 is a cross-sectional view of the component 104 having a component positioned outside the lid according to another alternate embodiment of the present invention.

Turning now to FIG. 6, a cross-sectional view of the component 104 having a component positioned outside the lid according to another alternate embodiment of the present invention is shown. In particular, components 602, for example discrete components such as capacitors, resistors, etc., may be placed on the exposed edge 318. However, because the seal 206 is used, the components 602 are protected. One benefit of placing the components 602 outside of the lid is that repair or replacement of these components may be performed without removing the lid. In a conventional integrated circuit having all of the components within the lid, failure of one of the components at electrical test requires removing the lid in order to rework the component or scrapping the entire package. In contrast, the component on the exposed edge 318 of the embodiment of FIG. 6 can be independently reworked without disturbing the lid and silicon. Also, after the component is reworked, the component can be completely sealed from foreign contaminants that may cause failure during operation using an adhesive.

Although a BGA having a flip chip is shown, the seal 206 may be employed in any component having a lid attached to a substrate. Also, although a square lid is shown, other lids, such as the lids disclosed in co-pending U.S. application Ser. No. 10/648,118 entitled "Conductive Lid and Method of Employing a Conductive Lid in an Integrated Circuit," filed Aug. 25, 2003 and co-pending U.S. application Ser. No. 10/782,184 entitled "Lid and Method of Employing a Lid on an Integrated Circuit," filed Feb. 18, 2004, both of which are assigned to the assignee of the present invention and are incorporated by reference in their entireties.

Turning now to FIG. 7, a series of figures shows the formation of an integrated circuit according to an alternate embodiment of the present invention. In particular, a flip chip 302 having a plurality of solder bumps 304 are coupled to a substrate 202 as shown in FIG. 7-A. An underfill layer 308 is then applied as shown in FIG. 7-B. An adhesive layer 310 is then preferably provided on top of a receiving surface on the substrate around the perimeter of the substrate as shown in FIG. 7-C. Additional components, such as components 602, may then be applied as shown in FIG. 7-D. Components 602 are attached in an area outside the area that will be occupied by the lid as shown in FIG. 7-E. The lid is attached to the substrate as shown in FIG. 7-E. Finally, a bonding agent is then applied to form the seal 206 and solder balls 412 are attached to the substrate as shown in FIG. 7-F. The bonding agent is preferably an adhesive if discrete components are used outside the lid. Although a solder may be employed for both the bonding agent 310 and the bonding agent to form the seal 206, an adhesive would preferably be used to form the seal 206 if a component is positioned outside the lid to avoid shorting the component positioned under the seal 206. The adhesive is preferably cured as necessary to form a seal. Although the steps of forming the integrated circuit are shown in a particular order, the steps need not be performed in the order shown. For example, the components 602 may be attached to the surface of the substrate at some earlier stage, such as before the lid is attached to the substrate.

Turning now to FIG. 8, a flow chart shows a method of forming an integrated circuit having a component outside a lid according to an embodiment of the present invention. In particular, a substrate having a surface for receiving a lid is provided at a step 802. A bonding agent is applied between a foot portion of the lid and the surface of the substrate at a step 804. The foot portion of the lid is positioned on the surface of the substrate at a step 806. A component is attached to the surface of the substrate outside of the foot portion of the lid at a step 808. Finally, a bonding agent is provided around the perimeter of the lid at a step 810. The various components and methods used in the steps of FIG. 8 or the remaining methods of FIGS. 9 and 10 may be any of the components or materials described in reference to FIGS. 1–7, or any other suitable materials.

Turning now to FIG. 9, a flow chart shows a method of applying a lid having a first length to a substrate having a second length according to an embodiment of the present invention. In particular, a lid comprising edges having a first length is provided at a step 902. A first component is then positioned on a substrate within an area receiving the lid wherein the substrate has a second length greater than the first length of the lid at a step 904. A second component is positioned on the substrate outside the area for receiving the lid at a step 906. The lid is then positioned on the substrate at a step 908. Because the four edges of the lid are positioned within the four edges of the substrate, a surface is available on the substrate outside the area occupied by the lid to place the second component. Finally, an adhesive seal is provided outside the edges of the lid at a step 910.

Turning now to FIG. 10, a flow chart shows a method of securing a lid to an integrated circuit using an adhesive according to an embodiment of the present invention. In particular, a substrate having a surface for receiving a lid is provided at a step 1002. The lid having a vent is positioned on the substrate at a step 1004. An adhesive is then applied on the substrate around the edges of the lid to form a seal between the substrate and the lid at a step 1006. The adhesive is then cured at a step 1008. Finally, gases are released at a step 1010 by way of the vent during the step of curing the adhesive.

It can therefore be appreciated that the new and novel an integrated circuit having a lid and method of securing a lid to an integrated circuit have been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. An integrated circuit having a lid, said integrated circuit comprising:
    a substrate having a flat surface and extending a first length;
    a lid having a recess and a foot portion, said lid having a second length shorter than said first length and being positioned on said flat surface of said substrate, leaving an exposed edge on said flat surface of said substrate along the length of said substrate; and
    a bonding agent positioned on said exposed edge of said flat surface on a side of said foot portion of said lid.

2. The integrated circuit of claim 1 further comprising a bonding agent below said foot portion of said lid.

3. The integrated circuit of claim 2 wherein said foot further comprises a lip.

4. The integrated circuit of claim 3 wherein said bonding agent surrounds said foot portion and extends over said lip.

5. The integrated circuit of claim 1 wherein said integrated circuit comprises a ball grid array.

6. The integrated circuit of claim 1 further comprising:
    a first component positioned on said substrate;
    the recess portion of the lid adapted to receive said first component; and
    a second component positioned on said substrate outside said foot portion;
    wherein the bonding agent is an adhesive seal on said substrate adjacent said foot and covering said second component, said adhesive seal forming a bond between said lid and said substrate.

7. The integrated circuit of claim 6 wherein said first component comprises a flip chip.

8. The integrated circuit of claim 6 wherein said second component comprises a discrete component.

9. The integrated circuit of claim 8 wherein said integrated circuit comprises a ball grid array.

10. The integrated circuit of claim 9 further comprising a printed circuit board receiving said ball grid array.

11. The integrated circuit of claim 1 further comprising:
    a die positioned on said substrate;
    the recess portion of the lid adapted to receive said die;
    wherein said bonding agent comprises a seal formed between said lid and said substrate by curing an adhesive positioned on said substrate adjacent said foot portion of said lid.

12. The integrated circuit of claim 11 further comprising a second seal formed by an adhesive placed between said foot portion and said substrate.

13. The integrated circuit of claim 11 wherein said seal prevents the release of gases during said curing.

14. The integrated circuit of claim 13 wherein said lid further comprises a vent enabling the release of gases during said curing.

15. The integrated circuit of claim 11 further comprising a thermal gel between said lid and said die.

* * * * *